US012512345B2

United States Patent
Kasai et al.

(10) Patent No.: US 12,512,345 B2
(45) Date of Patent: Dec. 30, 2025

(54) TEMPERATURE CONTROL DEVICE, TEMPERATURE CONTROL METHOD, AND INSPECTION APPARATUS

(71) Applicant: TOKYO ELECTRON LIMITED, Tokyo (JP)

(72) Inventors: Shigeru Kasai, Yamanashi (JP); Masahito Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1023 days.

(21) Appl. No.: 17/627,286

(22) PCT Filed: May 19, 2020

(86) PCT No.: PCT/JP2020/019796
§ 371 (c)(1),
(2) Date: Jan. 14, 2022

(87) PCT Pub. No.: WO2021/014724
PCT Pub. Date: Jan. 28, 2021

(65) Prior Publication Data
US 2022/0262661 A1 Aug. 18, 2022

(30) Foreign Application Priority Data
Jul. 19, 2019 (JP) ................................ 2019-133429

(51) Int. Cl.
*H01L 21/67* (2006.01)
*F25B 49/00* (2006.01)
(Continued)

(52) U.S. Cl.
CPC ........ *H01L 21/67248* (2013.01); *F25B 49/00* (2013.01); *G05D 23/19* (2013.01);
(Continued)

(58) Field of Classification Search
CPC ......... H01L 21/67248; H01L 21/67115; H01L 21/67103; H01L 21/67109; F25B 49/00;
(Continued)

(56) References Cited

U.S. PATENT DOCUMENTS 6,549,026 B1* 4/2003 DiBattista .......... G01R 31/2874
324/750.09

FOREIGN PATENT DOCUMENTS

| CN | 109983350 A | 7/2019 |
| JP | H10-135315 A | 5/1998 |

(Continued)

OTHER PUBLICATIONS

WO-2018100881-A1 translation (Year: 2018).*
PCT International Search Report, PCT Application No. PCT/JP2020/019796, Aug. 11, 2020, 11 pages.

*Primary Examiner* — Michael G Hoang
*Assistant Examiner* — Kurt Wolford
(74) *Attorney, Agent, or Firm* — Fenwick & West LLP

(57) ABSTRACT

This temperature control device for controlling the temperature of an object that is subject to temperature control is provided with: a heating mechanism which has a heat source for heating said object subject to temperature control; a temperature measuring instrument for measuring the peripheral temperature of said object subject to temperature control; a temperature estimation unit for dynamically estimating the temperature of said object subject to temperature control on the basis of power inputted to the heat source, power supplied to said object subject to temperature control, and the peripheral temperature; and a temperature controller for performing control on the temperature of said object subject to temperature control by controlling the power inputted to the heat source on the basis of the estimated temperature of said object subject to temperature control.

9 Claims, 15 Drawing Sheets

(51) Int. Cl.
    *G05D 23/19* (2006.01)
    *H05B 1/02* (2006.01)
    *H05B 3/00* (2006.01)

(52) U.S. Cl.
    CPC .... *G05D 23/1917* (2013.01); *H01L 21/67115* (2013.01); *H05B 1/0233* (2013.01); *H05B 3/0047* (2013.01); *H01L 21/67103* (2013.01); *H01L 21/67109* (2013.01)

(58) Field of Classification Search
    CPC .. G05D 23/19; G05D 23/1917; H05B 1/0233; H05B 3/0047
    See application file for complete search history.

(56) References Cited

FOREIGN PATENT DOCUMENTS

| | | | | |
|---|---|---|---|---|
| JP | 2018-151369 A | 9/2018 | | |
| WO | WO-0004582 A1 * | 1/2000 | ......... | G01R 31/2874 |
| WO | WO 01/006273 A1 | 1/2001 | | |
| WO | WO-2018100881 A1 * | 6/2018 | ......... | G01R 1/06711 |

\* cited by examiner $$u_{nl} = \frac{-k*\sigma}{|\sigma|+\eta}$$

TEMPERATURE CONTROL DEVICE, TEMPERATURE CONTROL METHOD, AND INSPECTION APPARATUS

TECHNICAL FIELD

The present disclosure relates to a temperature control device, a temperature control method, and an inspection apparatus.

BACKGROUND

In a semiconductor manufacturing process, a large number of electronic devices having predetermined circuit patterns are formed on a semiconductor wafer (hereinafter, simply referred to as a wafer). The formed electronic devices are inspected with respect to electrical characteristics and the like, and are classified into a non-defective device and a defective device.

Patent Document 1 describes an inspection apparatus that inspects electrical characteristics of electronic devices in a state of a wafer before being divided into respective electronic devices. This inspection apparatus includes a probe card having a large number of pin-shaped probes, a mounting table on which a wafer is mounted, and a tester. In this inspection apparatus, each of the probes of the probe card is brought into contact with electrode pads or solder bumps provided corresponding to electrodes of the electronic device formed on the wafer, and a signal from the electronic device is transmitted to the tester to inspect the electrical characteristics of the electronic device. Further, the inspection apparatus of Patent Document 1 has a temperature control device that controls a temperature of the mounting table using a refrigerant flow path or a heater in the mounting table in order to reproduce a mounting environment of the electronic device when the electrical characteristics of the device are inspected.

Meanwhile, Patent Document 2 describes a technology for statically estimating a temperature of an electronic device to be inspected from a predetermined heat transfer constant and a power consumption amount when an electronic device alone is inspected, and controlling the temperature of the electronic device based on the estimated temperature.

PRIOR ART DOCUMENTS

Patent Documents

Patent Document 1: Japanese Laid-open Patent Publication No. H10-135315
Patent Document 2: Japanese Patent No. 4703850

SUMMARY

Problems to Be Resolved by the Invention

The present disclosure provides a temperature control device, a temperature control method, and an inspection apparatus capable of estimating and controlling a temperature of a target object with high accuracy even when the target object generates heat.

Means for Solving the Problem

A temperature control device according to one aspect of the present disclosure is a temperature control device which controls a temperature of a target object subject to temperature control and includes a heating mechanism having a heating source configured to heat the target object, a temperature measuring instrument configured to measure a vicinity temperature of the target object, a temperature estimation part configured to dynamically estimate the temperature of the target object based on power applied to the heating source, power supplied to the target object, and the vicinity temperature, and a temperature controller configured to control the temperature of the target object by controlling the power applied to the heating source based on an estimated temperature of the target object.

Effect of the Invention

In accordance with the present disclosure, it is provided a temperature control device, a temperature control method, and an inspection apparatus capable of estimating and controlling a temperature of a target object subject to temperature control with high accuracy even when the target object generates heat.

DETAILED DESCRIPTION

Hereinafter, embodiments will be described with reference to the accompanying drawings.

Inspection Apparatus

First, an inspection apparatus according to an embodiment will be described.

Figure 1:
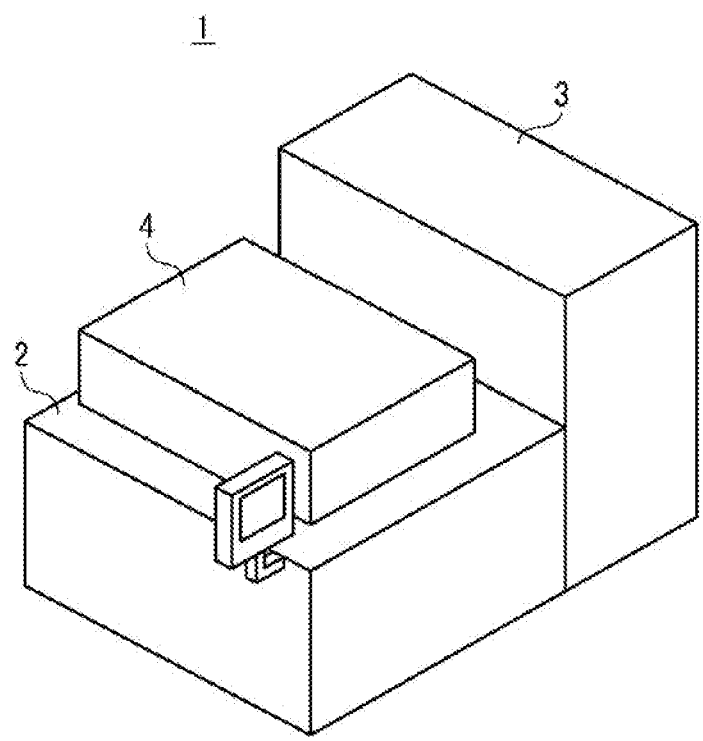
FIG. 1 is a perspective view illustrating a schematic configuration of an inspection apparatus according to an embodiment.
Figure 2:
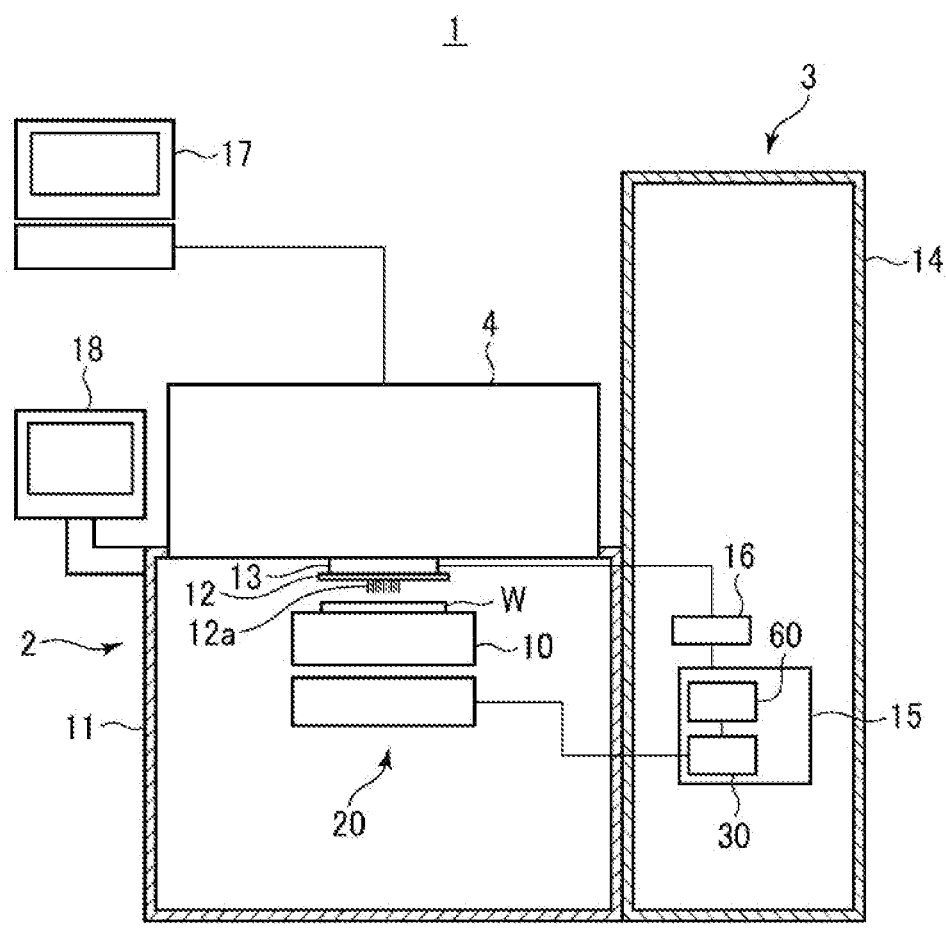
FIG. 2 is a front view illustrating a part of the inspection apparatus of FIG. 1 in cross section.

FIG. 1 is a perspective view illustrating a schematic configuration of an inspection apparatus according to an embodiment, and FIG. 2 is a front view illustrating a part of the inspection apparatus of FIG. 1 in cross section.

As illustrated in FIGS. 1 and 2, the inspection apparatus 1 inspects electrical characteristics of each of a plurality of electronic devices formed on a wafer W, as a substrate, and comprises an inspection part 2, a loader 3, and a tester 4.

The inspection part 2 has a housing 11 having a hollow inside and includes a stage 10 on which the wafer W to be inspected is adsorbed and fixed. Further, the stage 10 is configured to be movable in a horizontal direction and a vertical direction by a moving mechanism (not illustrated). A temperature control device 20 for controlling the temperature of the stage is provided below the stage 10. The temperature control device 20 will be described in detail below.

A probe card 12 is disposed above the stage 10 in the inspection part 2 to face the stage 10. The probe card 12 has a plurality of probes 12a that are contactors. Further, the probe card 12 is connected to the tester 4 via an interface 13. When each of the probes 12a comes into contact with an electrode of each of the electronic devices on the wafer W, each of the probes 12a supplies electric power from the tester 4 to the electronic device via the interface 13, or transmits a signal from the electronic device to the tester 4 via the interface 13. Therefore, the interface 13 and the probe 12a serve as a supply member that supplies electric power (power) to the electronic device.

The loader 3 has a housing 14, and a FOUP (not illustrated) that is a transport container in which the wafer W is housed is disposed in the housing 14. Further, the loader 3 has a transport mechanism (not illustrated), and the wafer W accommodated in the FOUP is taken out by a transport device and is transported to the stage 10 of the inspection part 2. Further, the wafer W on the stage 10 having inspection of electrical characteristics completed is transported by the transport device and is accommodated in the FOUP.

Further, in the housing 14 of the loader 3, are provided a controller 15 that performs various types of control such as temperature control of the electronic device to be inspected, and a potential difference measurement unit 16 that measures a potential difference in a potential difference generation circuit (not illustrated) in each of the electronic devices. The potential difference generation circuit is, for example, a diode, a transistor, or a resistor. The potential difference measurement unit 16 is connected to the interface 13, acquires a potential difference between two probes 12a in contact with two electrodes corresponding to the potential difference generation circuit and transmits the acquired potential difference to the controller 15. A connection structure of wiring from each of the probes 12a and the potential difference measurement unit 16 in the interface 13 will be described below.

The controller 15 is configured as a computer and comprises a temperature estimation part 60 and a temperature controller 30 included in the temperature control device 20. The controller 15 has a main controller having a plurality of control function parts that control each of constituent parts of the inspection apparatus 1 in addition to the temperature estimation part 60 and the temperature controller 30, and controls an operation of each of constituent parts of the inspection apparatus by the main controller. Further, the controller 15 has an input device, an output device, a display device, and a storage device. The control of each of constituent parts by the main controller is carried out by a processing recipe which is a control program stored in a storage medium (a hard disk, an optical disk, a semiconductor memory, or the like) built in the storage device.

The controller 15 and the potential difference measurement unit 16 may be provided in the housing 11 of the inspection part 2, and the potential difference measurement unit 16 may be provided in the probe card 12.

A user interface part 18 that constitutes a part of the controller 15 is provided in the housing 11 of the inspection part 2. The user interface part 18 serves to display information for a user and to enable the user to input an instruction, and includes, for example, an input part such as a touch panel and a keyboard and a display part such as a liquid crystal display.

The tester 4 has a test board (not illustrated) that reproduces a part of a circuit configuration of a mainboard on which the electronic device is mounted. The test board is connected to a tester computer 17 that determines the quality of the electronic device based on the signal from the electronic device to be inspected. In the tester 4, the circuit configurations of a plurality of types of mainboards can be reproduced by changing the test board.

The probe card 12, the interface 13, and the tester 4 constitute an inspection mechanism.

When the electrical characteristics of the electronic device are inspected, the tester computer 17 transmits data to the test board connected to the electronic device via each of the probes 12a. Then, the tester computer 17 determines whether or not the transmitted data has been correctly processed by the test board based on an electric signal from the test board.

Figure 3:
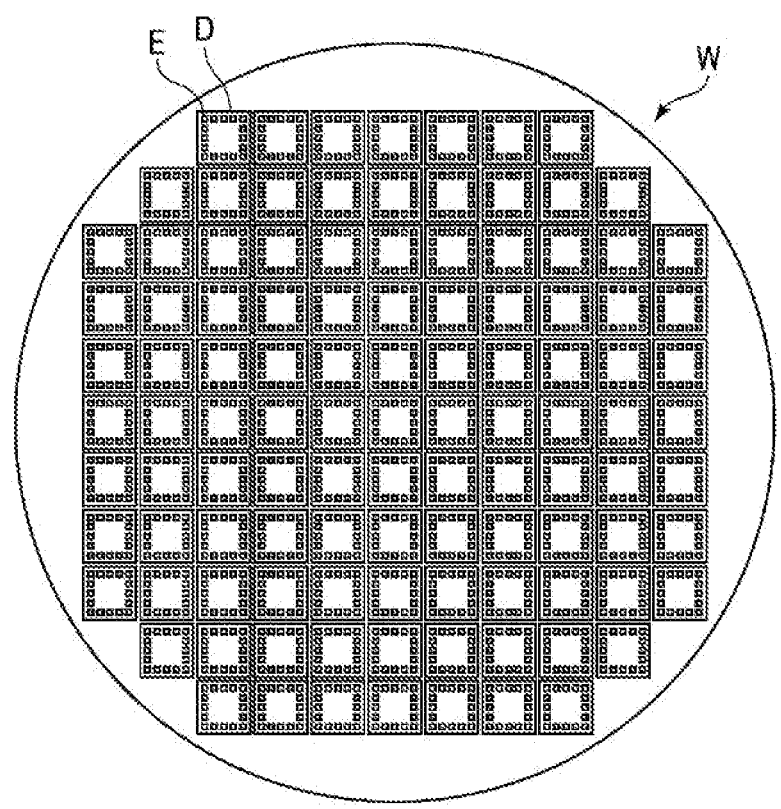
FIG. 3 is a plan view schematically illustrating a configuration of a wafer which is a substrate to be inspected.

As illustrated in FIG. 3, the wafer W, which is a substrate to be inspected, has a plurality of electronic devices D formed on a surface of a substantially disk-shaped silicon substrate with predetermined intervals from each other by performing an etching process or an interconnection process. An electrode E is formed on a surface of the electronic device D, and the electrode E is electrically connected to a circuit element within the electronic device D. A current can pass through the circuit element within each of the electronic devices D by applying a voltage to the electrode E.

Temperature Control Device

Figure 4:
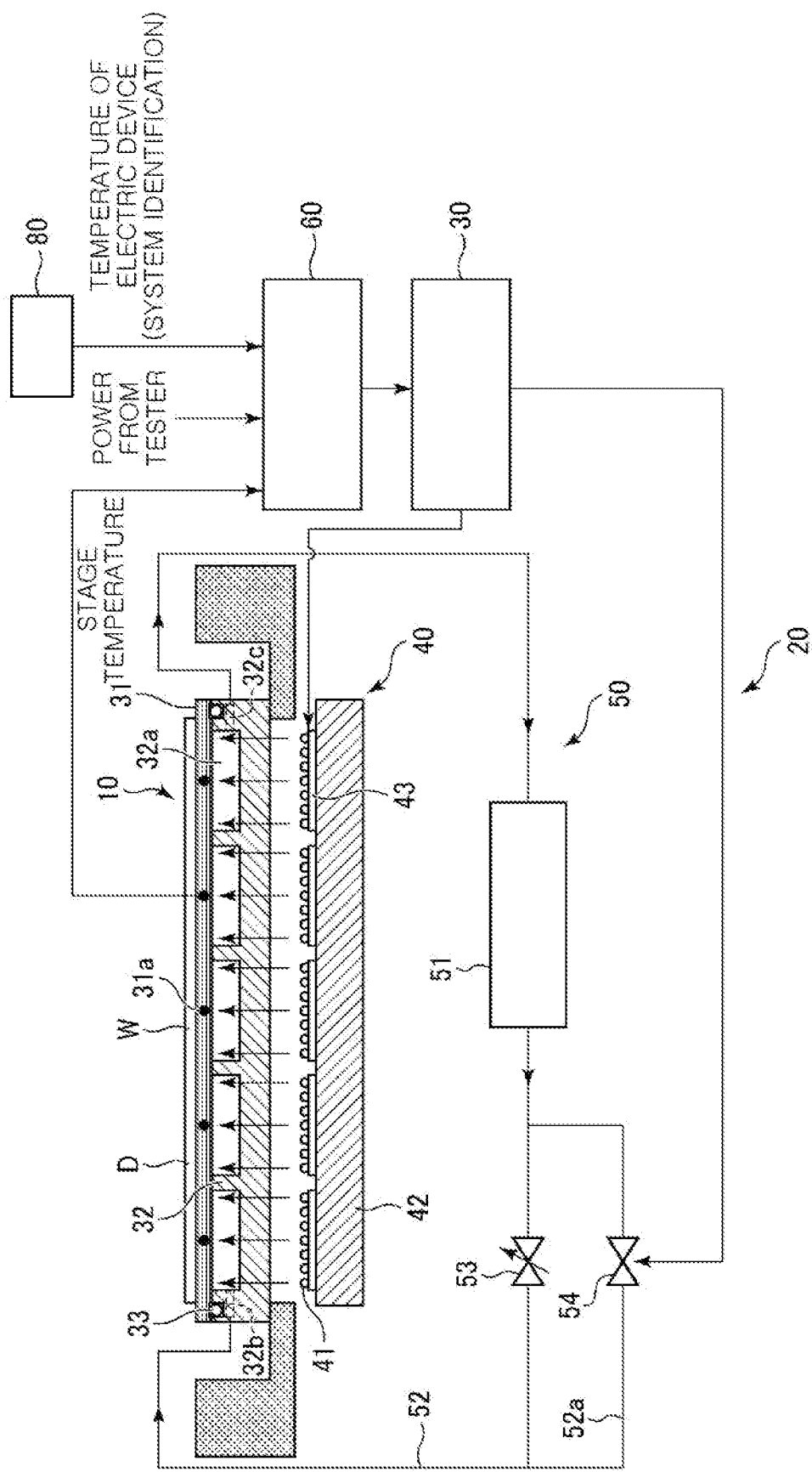
FIG. 4 is a cross-sectional view schematically illustrating an upper configuration of a stage and a temperature control device.

Next, a configuration of the temperature control device 20 will be described with reference to FIG. 4. FIG. 4 is a cross-sectional view schematically illustrating an upper configuration of the stage 10 and the temperature control device 20.

As illustrated in FIG. 4, the stage 10 includes a bottomed cylindrical member 32 and a lid member 31. The lid member 31 is mounted on the bottomed cylindrical member 32 via a sealing ring 33. The wafer W is adhered and held on the lid member 31.

The lid member 31 is formed in a disk shape and is made of, for example, SiC. SiC has high thermal conductivity and a high Young's modulus. Further, absorption efficiency with respect to light from a light-emitting diode (LED) 41 of a heating mechanism 40 described below is also high, and the lid member 31 can be efficiently heated by the light from the heating mechanism 40. Further, the lid member 31 can be formed by sintering SiC on a green sheet, and an amount of processing can be reduced.

An adhesion hole (not illustrated) for adhering the wafer W is formed in an upper surface of the lid member 31. Further, a plurality of temperature sensors 31a are embedded in the lid member 31 at positions separated from each other in a plan view.

The bottomed cylindrical member 32 is formed to have substantially the same diameter as the lid member 31 and is made of a material that is transparent with respect to a wavelength of light from an LED which will be described below. The inside of the bottomed cylindrical member 32 is formed with a groove for flowing a refrigerant, and the groove is covered with the lid member 31 to form a refrigerant flow path 32a. That is, the stage 10 has the refrigerant flow path 32a therein.

The temperature control device 20 includes the heating mechanism 40, a cooling mechanism 50, the temperature estimation part 60, and the temperature controller 30. The temperature control device 20 controls a temperature of the electronic device D formed on the wafer W on the stage 10 to be constant at a target temperature by heating of the heating mechanism 40 and cooling of the cooling mechanism 50.

The heating mechanism 40 is configured as a light irradiation mechanism and heats the wafer W by irradiating the lid member 31 of the stage 10 with light to heat the lid member 31, and heats the electronic device D formed on the wafer W.

Figure 5:
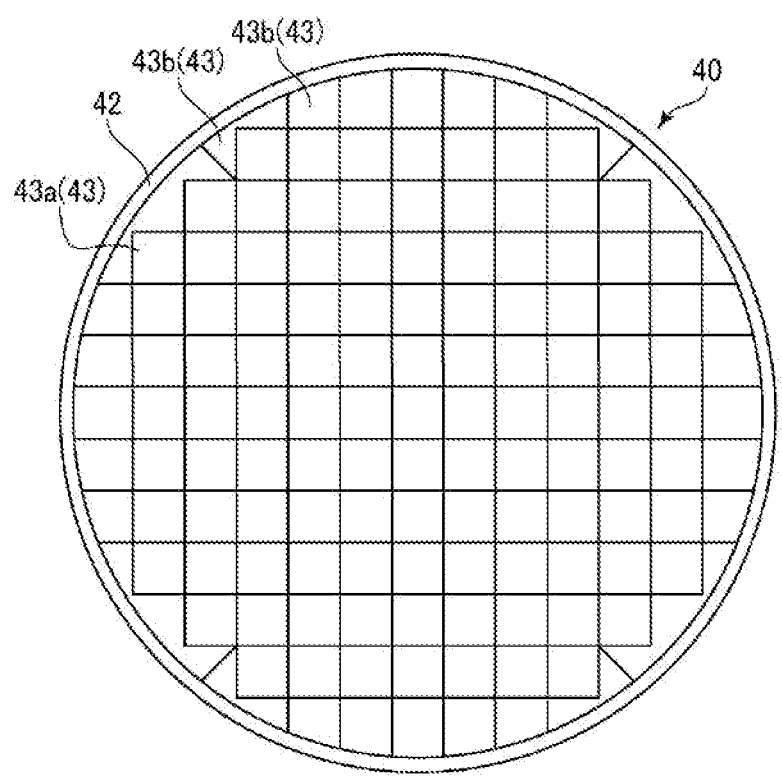
FIG. 5 is a plan view schematically illustrating a configuration of a heating mechanism.

The heating mechanism 40 is disposed to face a surface of the stage 10 opposite to a mounting surface of the wafer W, that is, a lower surface of the bottomed cylindrical member 32. The heating mechanism 40 includes a plurality of LEDs 41 that irradiate the wafer W with light as a heating source. Specifically, the heating mechanism 40 has a configuration in which a plurality of LED units 43 in which the plurality of LEDs 41 are unitized are mounted on a surface of a base 42. As illustrated in FIG. 5, the LED unit 43 in the heating mechanism 40 includes, for example, a square-shaped unit 43a arranged to correspond to the electronic device D in a plan view (refer to FIG. 3), and a non-square-shaped unit 43b provided on the outer periphery thereof. The units 43a and 43b cover almost the entire surface of the base 42, and it is possible to irradiate at least the entire portion of the lid member 31, on which the wafer W is placed, via the LEDs 41 of the LED unit 43.

Each of the LEDs 41 emits, for example, near-infrared light. The light emitted from the LED 41 (hereinafter, also referred to as "LED light") passes through the bottomed cylindrical member 32 of the stage 10 made of a light transmitting member. The refrigerant flowing through the refrigerant flow path 32a is made of a material that transmits the light from the LED 41, and the light transmitted through the bottomed cylindrical member 32 passes through the refrigerant flowing through the refrigerant flow path 32a and is incident on the lid member 31. When the light from the LED 41 is near-infrared light, polycarbonate, quartz, polyvinyl chloride, acrylic resin or glass can be used as the light transmitting member constituting the bottomed cylindrical member 32. These materials are easily processed and molded.

In the heating mechanism 40, the LED light that is incident on the lid member 31 on which the wafer W of the stage 10 is placed is controlled by LED unit 43 basis. Therefore, the heating mechanism 40 may radiate the LED light only to an arbitrary portion of the lid member 31, and may make the intensity of the radiated light different between the arbitrary portion and the other portion.

The cooling mechanism 50 includes a chiller unit 51, a refrigerant pipe 52, a variable flow rate valve 53, and a high-speed valve 54. The chiller unit 51 stores the refrigerant and controls a temperature of the refrigerant to a predetermined temperature. As the refrigerant, for example, water which is a liquid through which the light emitted from the LED 41 can pass is used. The refrigerant pipe 52 is connected to a supply port 32b and a discharge port 32c provided on a side portion of the bottomed cylindrical member and is also connected to the chiller unit 51. The refrigerant in the chiller unit 51 is circulated and supplied to the refrigerant flow path 32a via the refrigerant pipe 52 by a pump (not illustrated) provided in the refrigerant pipe 52. The variable flow rate valve 53 is provided at the downstream side of the chiller unit 51 of the refrigerant pipe 52, and the high-speed valve 54 is provided on a bypass pipe 52a that bypasses the variable flow rate valve 53 at the downstream side of the chiller unit 51. In the variable flow rate valve 53, a flow rate can be set, and the refrigerant can be supplied with a fixed amount of the set flow rate. Further, the high-speed valve 54 is opened/closed (on/off) at high speed and can supply/stop the refrigerant flowing through the bypass pipe 52a at high speed.

The temperature estimation part 60 estimates the temperature of the electronic device D using, for example, the electric power supplied from the tester 4 to the electronic device D during the inspection, the electric power applied to the irradiation LED for heating the electronic device D (an amount of irradiated heat of the LED), and a temperature in the vicinity of the electronic device D (for example, a detected value of the temperature sensor 31a). Details of the temperature estimation part 60 will be described below. A signal from a temperature measurement circuit 80 is also inputted to the temperature estimation part 60.

Figure 6:
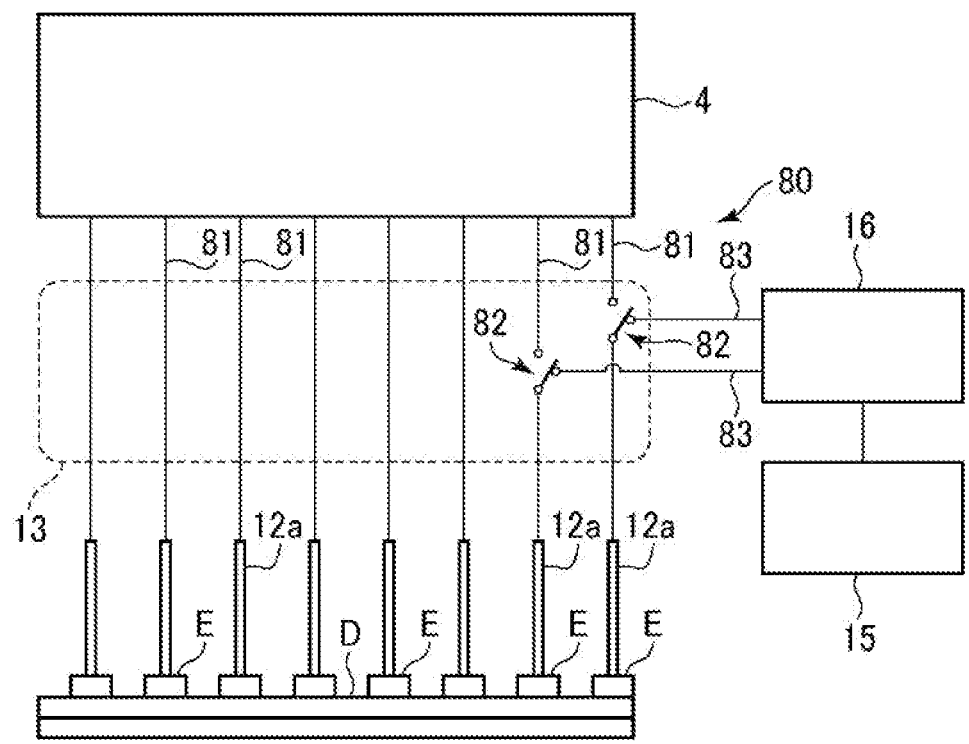
FIG. 6 is a view schematically illustrating a configuration of a circuit for measuring a temperature of an electronic device.

The temperature measurement circuit 80 is configured to be able to measure the temperature of the electronic device D, and as illustrated in FIG. 6, each of the probes 12a is connected to the tester 4 by a plurality of wirings 81 disposed in the interface 13. A relay 82 is provided in each of two wirings 81 that connects two probes 12a in contact with two electrodes E of the potential difference generation circuit (for example, a diode) in the electronic device D to the tester 4. The relay 82 can also be connected to a wiring 83 of the potential difference measurement unit 16. That is, each of the relays 82 can switch a potential of each of the electrodes E to either the tester 4 or the potential difference measurement unit 16 and transmit the potential thereto. For example, when the electrical characteristics of the electronic device D are inspected, the potential of each of the electrodes E is transmitted to the potential difference measurement unit 16 at a predetermined timing after a voltage at the time of mounting is applied to each of the electrodes E. In the above potential difference generation circuit, it is known that a potential difference generated when a predetermined current is applied thereto differs according to temperature. Therefore, the temperature of the electronic device D can be measured based on the potential difference of the potential difference generation circuit of the electronic device D, that is, the potential difference between the two electrodes E (the probes 12a) of the potential difference generation circuit. The temperature measurement circuit 80 is configured of the potential difference generation circuit in the electronic device D, the two probes 12a in contact with the two electrodes, the two wirings 81 connected to them, the relay 82, the wiring 83, and the potential difference measurement unit 16. However, since the relay 82 is often connected to the wiring 81 side of the tester 4 side during the inspection, the temperature measurement circuit 80 uses, for example, the temperature of the electronic device D only at the time of a system of the temperature estimation part 60 identification, and uses a temperature estimated by the temperature estimation part 60 for temperature control of the electronic device D.

The temperature controller 30 controls the temperature of the electronic device D by the heating mechanism 40 and the cooling mechanism 50 based on the estimated temperature of the electronic device D estimated by the temperature estimation part 60.

Temperature Estimation Part

Next, the temperature estimation part 60 will be described in detail.

As described above, the temperature estimation part 60 dynamically estimates the temperature of the electronic device D using [1] the electric power supplied from the tester 4 to the electronic device D during the inspection, [2] the electric power applied to the irradiation LED for heating the electronic device D (an amount of irradiated heat of the LED), and [3] the temperature in the vicinity of the electronic device D all of which are measurable.

Specifically, the temperature estimation part 60 estimates the temperature of the electronic device by a dynamic system (a dynamic control system) that represents a temperature rise due to heat generation of the electronic device D by a dynamic model with the above [1] and [2] as manipulated variables and the [3] as an output, which are measurable. In this case, in the constructed dynamic system, the temperature rise due to the heat generation of the electronic device D is an internal state that cannot be directly measured, and such unmeasurable internal state can be estimated by constructing an observer system (an observer control system) using an observer. Estimating unknown quantities using the observer has been known from the past.

Figure 7:
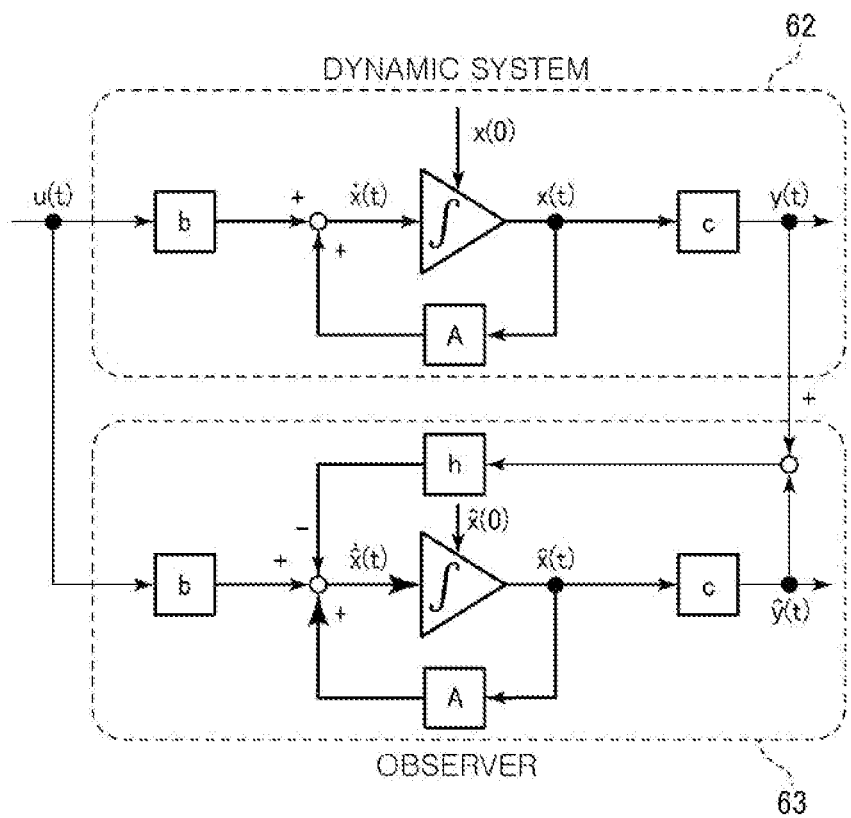
FIG. 7 is a block diagram illustrating a basic observer system in a temperature estimation part.

FIG. 7 shows a fundamental observer system 61. The dynamic system 62 is an LED heating system. u(t) denotes an amount of irradiated heat of the LED, and y(t) denotes a temperature in the vicinity of the electronic device D. The vicinity temperature means a temperature measured in the vicinity of the electronic device D. In this example, a detection value of the temperature sensor 31a of the lid member (a wafer chuck) 31, on which the wafer is adhered, is used as the vicinity temperature. The observer 63 estimates the temperature rise due to heat generation of the electronic device D, which is an internal state of the electronic device that cannot be measured, using the above u(t) and y(t). As the estimation method, a method of designating a pole of the observer and determining an observer gain h can be used. As a result, system matrices A, b, and c can be identified in advance, and the temperature of the electronic device can be estimated using the system matrices A, b, and c, the directly observed amount of irradiated heat of the LED, and a signal of the temperature sensor.

The theory of the observer is as follows.

A state equation of the system is described in (1) below. y denotes an output.

[Equation 1]

$$\dot{x} = Ax + Bu \quad y = cx \tag{1}$$

A copy of the state estimation illustrated in (2) below is written.

[Equation 2]

$$\dot{\hat{x}} = A\hat{x} + Bu \quad \hat{y} = c\hat{x} \tag{2}$$

When a term of h is added to a state quantity of (2) so that the output is the same, it becomes as illustrated in (3).

[Equation 3]

$$\dot{\hat{x}} = A\hat{x} + Bu + h(y - \hat{y}) = \dot{\hat{x}} = A\hat{x} + Bu + h(y - c\hat{x})$$

$$\dot{\hat{x}} = (A - hc)\hat{x} + hy + ad + Bu \tag{3}$$

Here, when

[Equation 4]

$$e = \hat{x} - x$$

it becomes the following (4).

[Equation 5]

$$\dot{e} = \dot{\hat{x}} - \dot{x} = (A - hc)(\hat{x} - x) = (A - hc)e \tag{4}$$

Therefore, when A-hc has a stable pole, e converges to zero.

The above is a fundamental observer system when the dynamic system is an LED heating system, but in the present embodiment, an extended observer system in which the electric power supplied from the tester 4 to the electronic device D is also taken into account is constructed.

In this way, by using the extended observer system in which the electric power supplied from the tester 4 to the electronic device D is also taken into account, the electric power supplied from the tester 4 to the electronic device D, which had to be conventionally regarded as a disturbance, can now be regarded as a manipulated variable. Thus, the temperature of the electronic device D in which the electric power from the tester is taken into account can be estimated by the observer as a state quantity. The temperature of the electronic device D estimated in this way becomes an output, and the temperature is controlled by the temperature controller 30.

Figure 8:
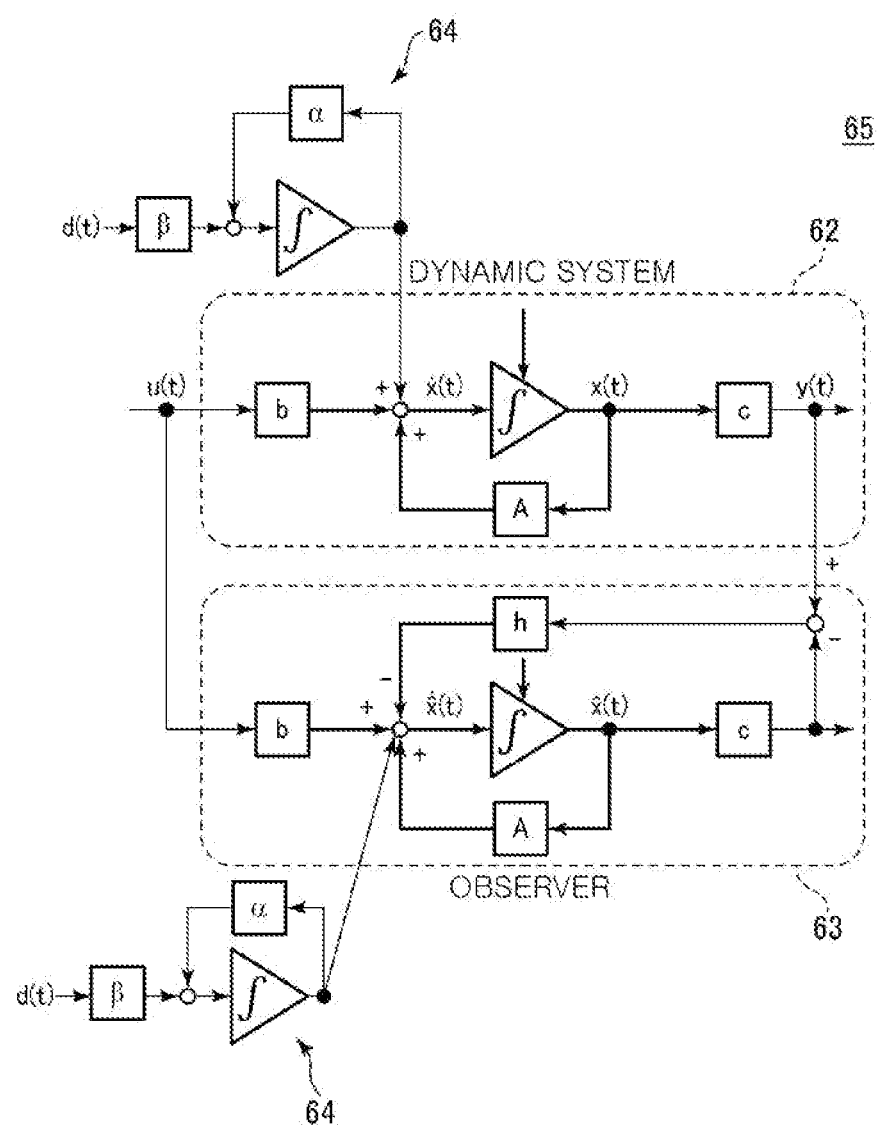
FIG. 8 is a block diagram illustrating an extended observer system in which electric power supplied from a tester to an electronic device is also added to the observer system of FIG. 7.

FIG. 8 shows the extended observer system 65 at this time. Here, a power supply circuit part 64 that supplies electric power from the tester 4 to the electronic device D is added to the dynamic system 62 and the observer 63 of FIG. 7. When a transfer function from the power supplied from the tester 4 to the electronic device D to the state quantity is identified, it becomes the following (5).

[Equation 8]

$$\dot{x} = \alpha x + \beta u \tag{5}$$

Figure 9:
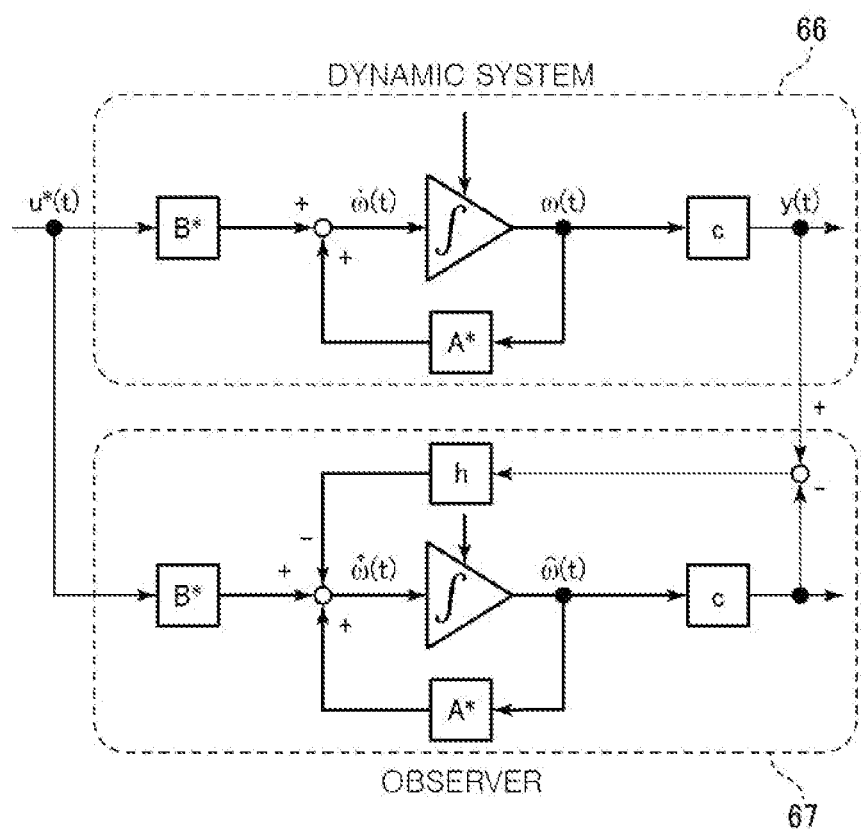
FIG. 9 is a block diagram illustrating a case in which the extended observer system is modified into a general observer system.

When the extended observer system 65 illustrated in FIG. 8 is rewritten into a general observer system as illustrated in FIG. 7, it becomes as illustrated in FIG. 9. A numeral 66 indicates a dynamic system, and a numeral 67 indicates an observer. U*(t) denotes an input including the amount of irradiated heat of the LED and the electric power supplied from the tester 4 to the electronic device D. A state equation of the extended observer system 65 is as described in (6) below.

[Equation 7]

$$\dot{\omega} = A^*\omega + B^*u^* \quad y = c\omega \quad (6)$$

$$\omega = \begin{bmatrix} x_{pl} \\ x_d \end{bmatrix} \quad A^* = \begin{bmatrix} A & \ddots \\ \ddots & \alpha \end{bmatrix} \quad B^* = \begin{bmatrix} B \\ \beta \end{bmatrix} \quad u^* = \begin{bmatrix} u \\ d \end{bmatrix}$$

Here, pl denotes an original system, d denotes the electric power from the tester to the electronic device D, and $\alpha$ and $\beta$ denote parameters thereof.

Similar to the basic system, a copy of a state of the extended system is written as illustrated in (7) below.

[Equation 8]

$$\hat{\dot{\omega}} = A^*\hat{\omega} + B^*u^* \quad y = c\omega \quad (7)$$

The temperature of the electronic device D is estimated using the observer 67, and the temperature is controlled by the temperature controller 30 using the estimated temperature of the electronic device.

In the present embodiment, a measured value of the temperature sensor 31a provided on the lid member 31 is used as the vicinity temperature, but the present disclosure is not limited thereto. For example, a temperature sensor may be installed at a pogo pin which is a part of an interface part for connecting the probe 12a to the tester 4, and a measured value of the temperature sensor may be used, and a measured value by a fluorescent fiber thermometer may also be used.

Temperature Controller

Next, the temperature controller 30 will be described in detail.

The temperature controller 30 controls the temperature of the electronic device D using the temperature (a junction temperature) of the electronic device D estimated by the temperature estimation part 60 described above.

Hereinafter, a suitable example of the temperature controller 30 will be described. However, a control method of the temperature controller 30 is not particularly limited, and various control methods conventionally used can be applied.

First Example of Temperature Controller

In a first example of the temperature controller 30, the temperature is controlled by sliding mode control using power (a current value output) applied to the LED 41, which is the heating source, as manipulated variable and cooling mode control using power (that is, an opening and closing signal of the high-speed valve) applied to the high-speed valve, which is a cooling source, as manipulated variable.

The sliding mode control is a control method for switching control above and below a switching hyperplane (a switching surface) to constrain a state to a preset switching hyperplane in a state space. When an initial state of a subject to be controlled is outside the switching hyperplane, the state of the subject to be controlled is caused to reach and be constrained to the switching hyperplane in a finite time (an arrival mode). When the state of the subject to be controlled reaches the switching hyperplane, the state converges to a target value while being subjected to a sliding operation on the switching hyperplane (a sliding mode). A control input u of the sliding mode control is a sum of a linear term (a linear control manipulated variable) $u_l$ and a nonlinear term (a nonlinear control manipulated variable) $u_{nl}$ and can be expressed by the following Equation.

$$u = -(SB)^{-1}SAx - K(SB)^{-1} \cdot \text{sgn}(\sigma)$$

$$= -(SB)^{-1}\{Sax + K \cdot \text{sgn}(\sigma)\}$$

$$\sigma = Sx$$

Figure 10:
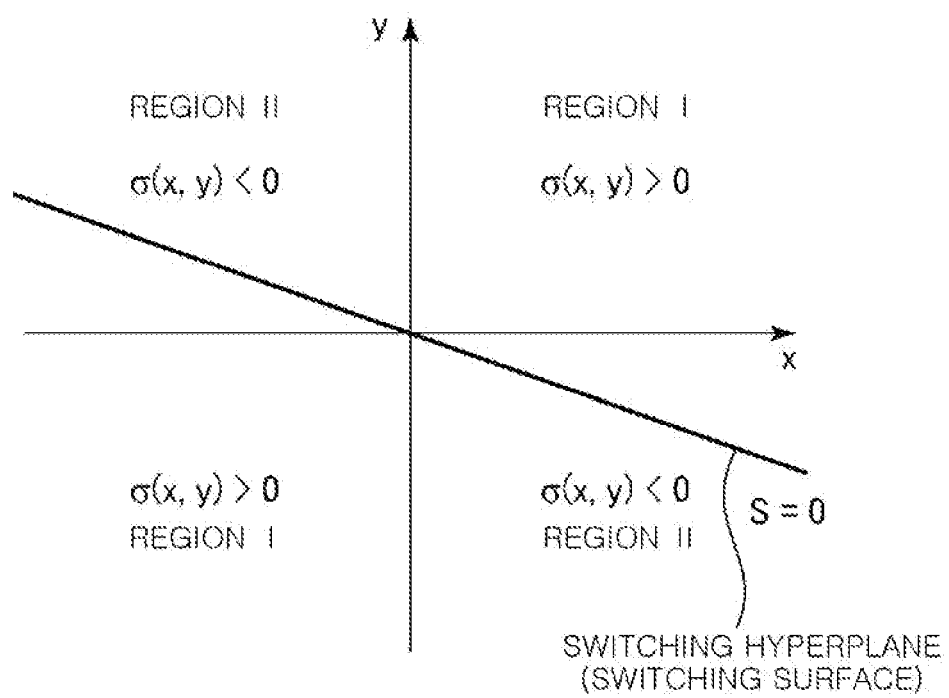
FIG. 10 is a diagram for describing sliding mode control.

SAx denotes the linear term, and $K \cdot \text{sgn}(\sigma)$ denotes the non-linear term. A and B denotes matrices of a state equation, and S and K denote control parameters. A function sgn represents a discontinuous function, and $\text{sgn}(\sigma)$ denotes a switching function of the sliding mode. The switching hyperplane can be designed in a framework of linear control, and in the sliding mode, a region II and a region I illustrated in FIG. 10 are moved back and forth on the switching hyperplane by the non-linear term in an extremely short time. That is, in the sliding mode, the linear term (the linear control manipulated variable) switches the state of the control system so that a control error is minimized on the hyperplane, and the non-linear term (the non-linear control manipulated variable) directs the state of the control system to the switching hyperplane when there is a modeling error or uncertain disturbance.

Figure 11:
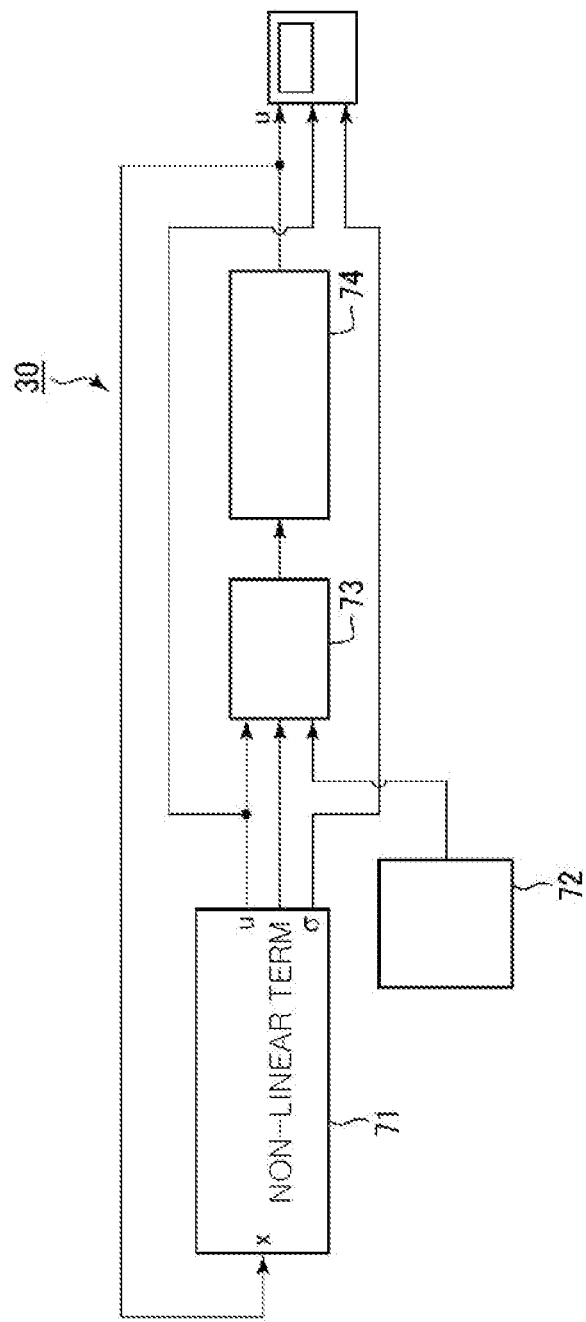
FIG. 11 is a block diagram illustrating a control block of a temperature controller of a first example.

FIG. 11 is a view illustrating a control block of the temperature controller 30 of the first example. In this example, the temperature controller 30 includes a sliding mode controller 71, a cooling mode controller 72, a switching controller 73, and a plant model 74.

Figure 12:
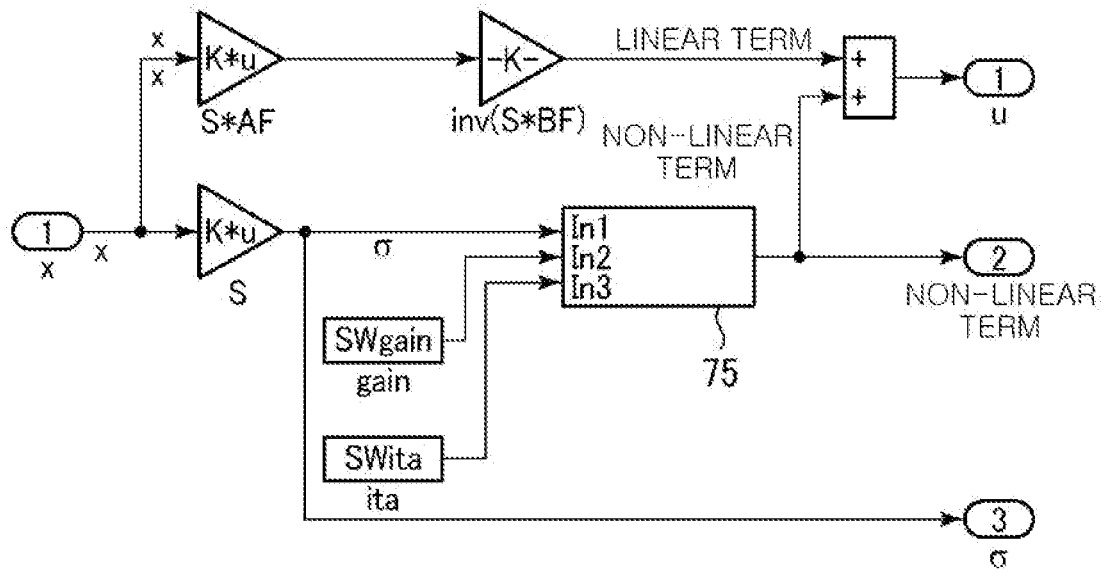
FIG. 12 is a block diagram illustrating the inside of a sliding mode controller in the temperature controller of the first example of FIG. 11.
Figure 13:
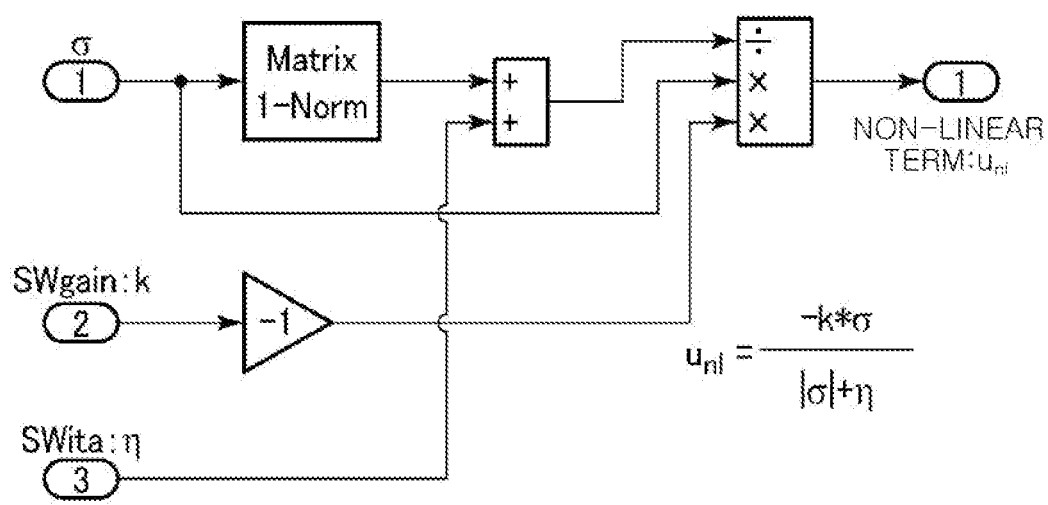
FIG. 13 is a block diagram illustrating a nonlinear input part of the sliding mode controller of FIG. 12.

The sliding mode controller 71 outputs power (an output as a current value) applied to the LED 41 of the heating mechanism 40 as a manipulated variable, and controls the temperature. In the sliding mode controller 71, as illustrated in FIG. 12, an estimated temperature x of the electronic device D is inputted, and the control input u is formed of the linear term (a linear gain term) and the non-linear term (a non-linear gain term) generated by a non-linear input unit 75. As illustrated in FIG. 13, the non-linear input unit 75 generates a non-linear input (a non-linear term):$u_{nl}$ by the switching function $\sigma$, SWgain:k, and SWita:$\eta$. $u_{nl}$ is represented by the following Equation.

$$u_{nl} = k \cdot \sigma/(|\sigma| + \eta)$$

$\eta$ denotes a chattering suppression term. Since the non-linear input (the non-linear term):$u_{nl}$ has an infinite switching frequency, the state quantity is chattered (high frequency-vibrated) in the vicinity of the switching hyperplane. Therefore, $\eta$ is used to suppress the chattering and to smooth the input.

Figure 14:
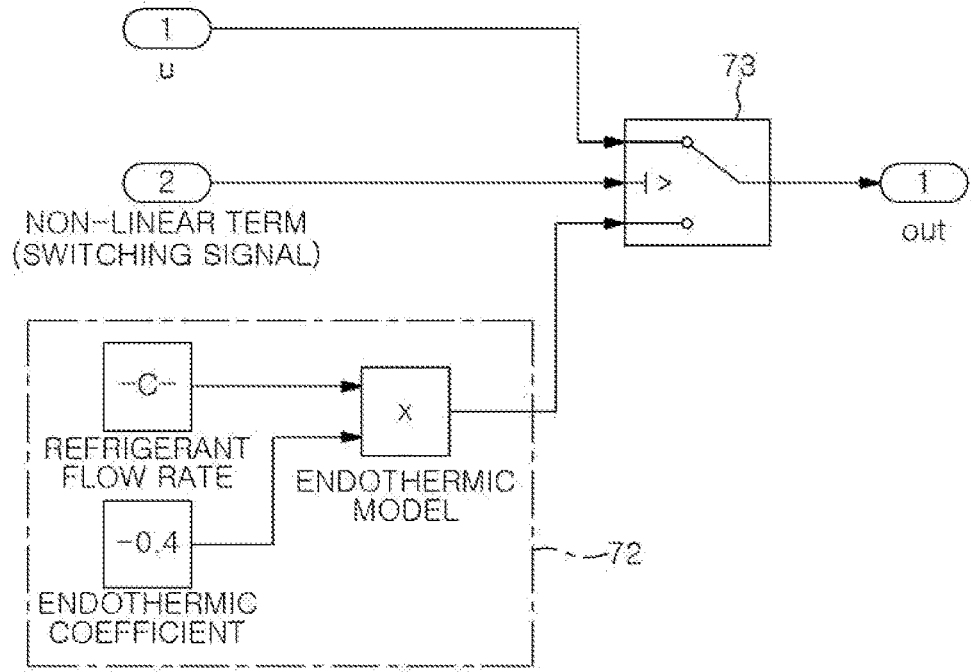
FIG. 14 is a block diagram illustrating a configuration of a cooling mode controller and a switching controller in the temperature controller of the first example of FIG. 11 and sending and receiving of signals therebetween.

FIG. 14 is a block diagram illustrating the inside of the cooling mode controller 72 and the switching controller 73.

The cooling mode controller 72 performs cooling control using the power (the opening and closing signal of the high-speed valve 54) applied to the high-speed valve 54, which is the cooling source, as a manipulated variable. As a result, an amount of the refrigerant supplied to the refrigerant flow path 32a of the stage 10 is controlled, and the temperature of the electronic device D is controlled. An output of the cooling mode controller 72 is calculated by an endothermic model based on a refrigerant flow rate and an endothermic coefficient. Although the endothermic coefficient is displayed as −0.4 in FIG. 14, this is only an example, and a value thereof varies according to the electronic device or the like.

The switching controller 73 uses a value of the non-linear term $u_{nl}$ of the sliding mode controller as a switching signal. That is, the switching controller 73 determines whether to use an output (a control input) of the sliding mode controller 71 as it is, or to use an output of the cooling mode controller 72 as a second manipulated variable without using the output of the sliding mode controller 71 according to the value of the non-linear term $u_{nl}$.

Using the output (the control input) of the sliding mode controller 71 as it is means outputting the output of the sliding mode controller 71 to the LED 41, which is a heating source, as a first manipulated variable.

Using the output of the cooling mode controller 72 as the second manipulated variable means using the output of the high-speed valve which is the cooling source of the cooling mode controller 72 as the second manipulated variable.

Specifically, in the switching controller 73, when the value of the nonlinear term $u_{nl}$ is positive (one side of the switching hyperplane; the region I in FIG. 10), the output of the sliding mode controller 71 is output to the LED 41, as it is, as the first manipulated variable. Further, when the value of the nonlinear term $u_{nl}$ is negative (the other side of the switching hyperplane; the region II in FIG. 10), the output of the high-speed valve (the opening/closing signal of the high-speed valve) which is the cooling source of the cooling mode controller 72 is used as the second manipulated variable. An opening/closing time of the high-speed valve is as high as 0.1 sec or less, and the high-speed valve 54 can be opened or closed according to high-speed switching due to the non-linear term $u_{nl}$, and temperature control can be performed with high controllability.

Figure 15:
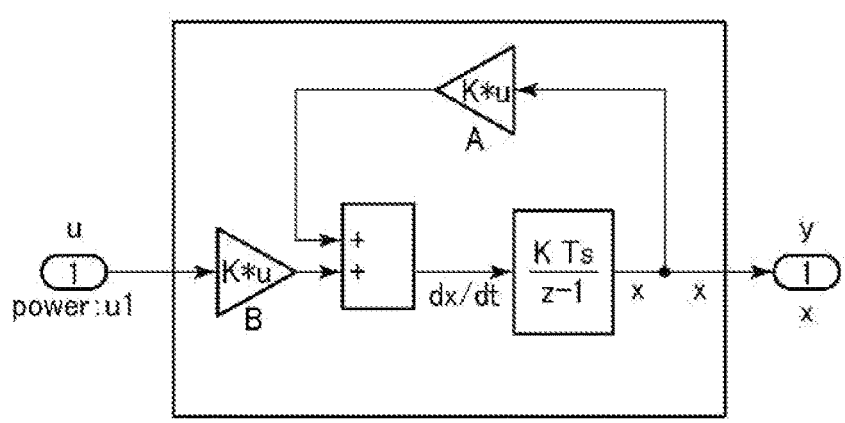
FIG. 15 is a block diagram illustrating the inside of a plant model.

The plant model 74 is a physical model of the electronic device D (the stage 10) as a target object of which temperature is controlled, and is as illustrated in FIG. 15. Also, a signal outputted from the switching controller 73 is inputted to the plant model 74, and a control signal is obtained through necessary calculations in the plant model 74.

The temperature control of the electronic device D is performed by the temperature controller 30 while the refrigerant is caused to flow at a constant flow rate through the refrigerant flow path 32a by the variable flow rate valve 53 of the cooling mechanism 50 to absorb heat. That is, the temperature controller 30 controls the temperature by the sliding mode control using the power applied to the LED 41, which is a heating source, as manipulated variable and the cooling mode control using the power (the opening and closing signal of the high-speed valve) applied to the high-speed valve 54, which is the cooling source, as manipulated variable. Here, the switching controller 73 determines whether to perform the sliding mode control using the nonlinear term $u_{nl}$ as it is or to perform the cooling mode control using the nonlinear term $u_{nl}$ as the opening/closing signal of the high-speed valve 54 according to the value of the nonlinear term $u_{nl}$. When the value of the non-linear term $u_{nl}$ of the sliding mode control is positive, the temperature control is performed by the sliding mode control using the power applied to the LED 41 directly as the manipulated variable. When the value of the non-linear term $u_{nl}$ of the sliding mode control is negative, the non-linear term $u_{nl}$ is outputted as the opening/closing signal of the high-speed valve 54, and the sliding mode control of the LED 41 is switched to the cooling mode control. At this time, the output of the sliding mode controller 71 is not used for temperature control. By using the cooling mode control, the electronic device D can be cooled more than when the LED 41 is turned off. Thus, even when the voltage (the electric power) applied from the tester 4 to the electronic device D is large and a very large amount of heat is generated, the temperature controllability of the electronic device D is ensured.

Second Example of Temperature Controller

Figure 16:
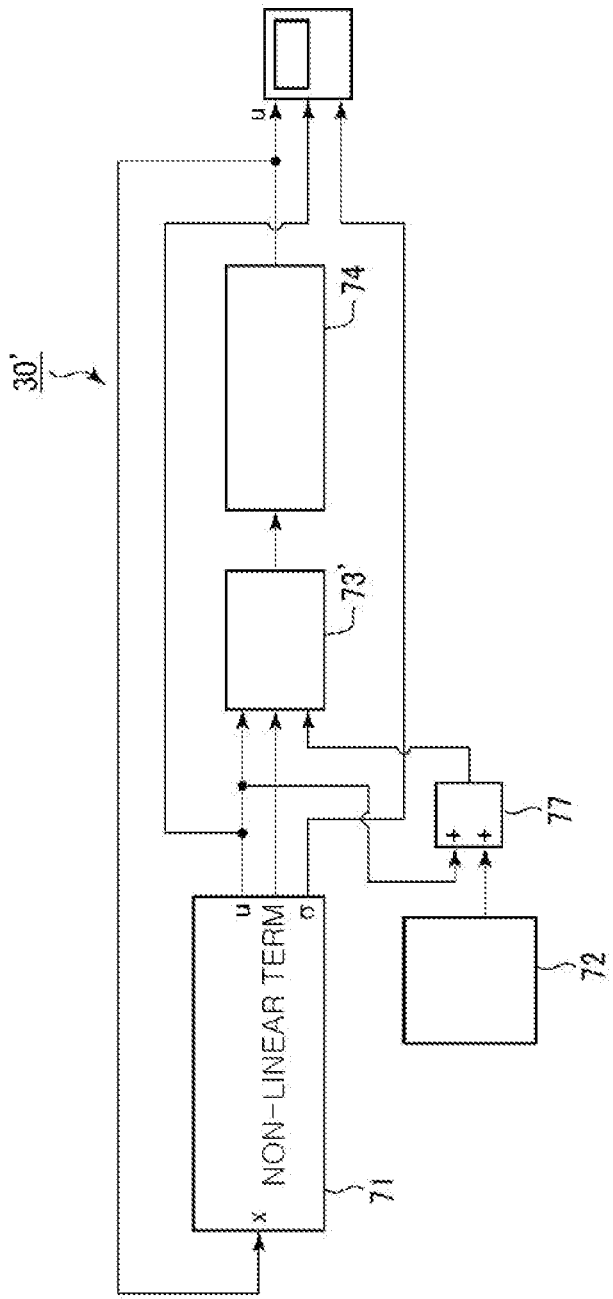
FIG. 16 is a block diagram illustrating a control block of a temperature controller of a second example.

A basic configuration of a second example of the temperature controller is the same as that of the first example, but the control method is different from that of the first example, as illustrated in FIG. 16 described below.

Also, in a temperature controller of this example, as in the first example, the control based on the sliding mode control using the power (the current value output) applied to the LED 41, which is the heating source, as manipulated variable is performed based on the temperature estimation result of the electronic device D. Further, in the temperature controller of this example, as in the temperature controller of the first example, in addition to the sliding mode control, the cooling mode control using the power applied to the high-speed valve (that is, the opening and closing signal of the high-speed valve) as manipulated variable is performed. However, the temperature controller of this example is different from the temperature controller of the first example in that a control signal is also sent to the LED 41, which is the heating source, in a cooling mode.

Hereinafter, a temperature controller of this example will be described in detail as a temperature controller 30'.

FIG. 16 is a diagram illustrating a control block of the temperature controller 30'. The temperature controller 30' includes a sliding mode controller 71, a cooling mode controller 72, an adder 77, a switching controller 73', and a plant model 74. The basic configurations of the sliding mode controller 71, the cooling mode controller 72, and the plant model 74 are the same as those in the temperature controller 30 of the first example.

Figure 17:
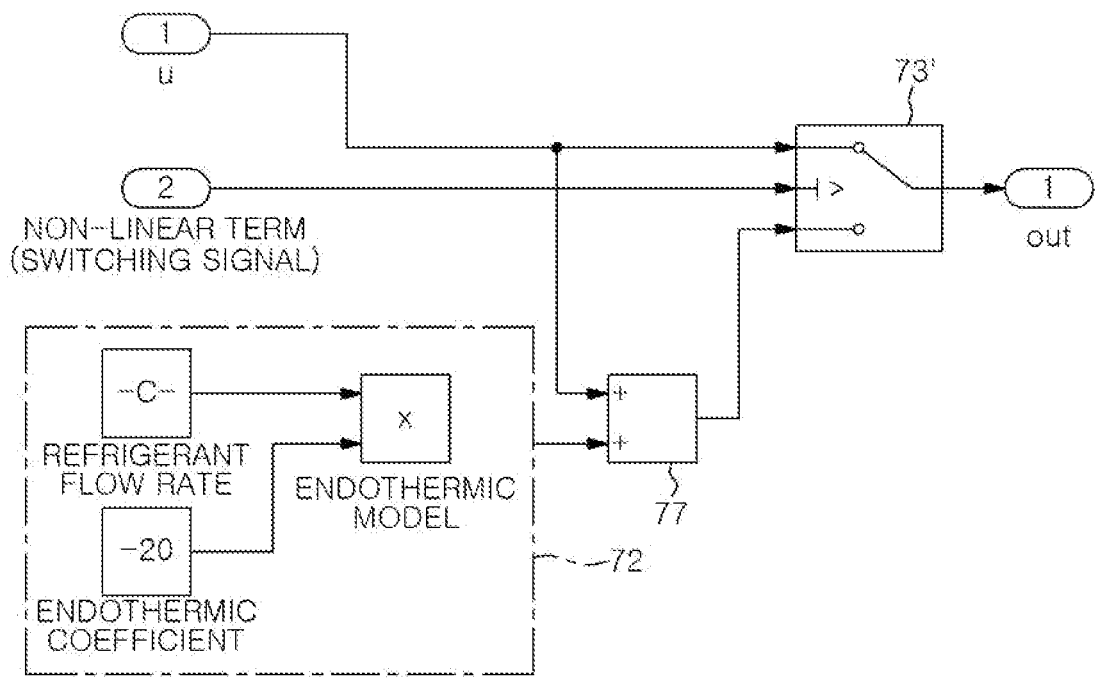
FIG. 17 is a block diagram illustrating a configuration of a cooling mode controller and a switching controller in the temperature controller of the second example of FIG. 16 and sending and receiving of signals therebetween.

FIG. 17 is a block diagram illustrating the configurations of the cooling mode controller 72, the adder 77, and the switching controller 73' and transmission and reception of a signal therebetween.

As described above, the cooling mode controller 72 performs cooling control using the power (the opening and closing signal of the high-speed valve 54) applied to the high-speed valve 54, which is the cooling source, as manipulated variable. As a result, the amount of the refrigerant supplied to the refrigerant flow path 32a of the stage 10 is controlled, and the temperature of the electronic device D is controlled. The output of the cooling mode controller 72 is calculated by an endothermic model based on a refrigerant flow rate and an endothermic coefficient. Although the endothermic coefficient is displayed as −20 in FIG. 17, this is only an example, and the value varies according to the electronic device or the like.

As in the switching controller 73 of the first example, the switching controller 73' uses the value of the non-linear term $u_{nl}$ of the sliding mode controller as a switching signal. Then, the switching controller 73' determines whether to use the output of the sliding mode controller 71 as it is, or to use the second manipulated variable according to the value of the nonlinear term $u_{nl}$. The switching controller 73' uses a sum of the output of the sliding mode and the output of the cooling mode controller 72 in the adder 77 as the second manipulated variable. That is, the second manipulated variable is the sum of the output from the sliding mode controller 71 to the LED 41 which is the heating source and the output of the high-speed valve which is the cooling source of the cooling mode controller 72.

Using the output (the control input) of the sliding mode controller 71, as it is, means outputting the output of the sliding mode controller 71 to the LED 41, which is a heating source, as a manipulated variable.

Specifically, when the value of the nonlinear term $u_{nl}$ is positive (one side of the switching hyperplane; the region I in FIG. 10), the switching controller 73' outputs the output of the sliding mode controller 71 directly to the LED 41 as the first manipulated variable. Further, when the value of the nonlinear term $u_{nl}$ is negative (the other side of the switching hyperplane; the region II in FIG. 10), the sum of the output of the sliding mode controller 71 and the output of the high-speed valve (the opening and closing signal of the high-speed valve) which is the cooling source of the cooling mode controller 72 is used as the second manipulated variable.

As described above, the cooling mode controller 72 opens/closes the high-speed valve 54, which is operated at a high speed of 0.1 sec or less, according to high-speed switching due to the nonlinear term $u_{nl}$. Thus, the electronic device D can be cooled more than the case when the LED 41 is turned off, and the temperature controllability of the electronic device D even when the electronic device D generates a very large amount of heat is ensured. Further, due to not only the output of the high-speed valve of the cooling mode controller 72 but also the output of the sliding mode controller 71 being added as the second manipulated variable, good controllability can be obtained by relaxing a transient response to rapid cooling.

Inspection Process by Inspection Apparatus

Next, an example of an inspection process for the wafer W using the inspection apparatus 1 will be described.

First, the wafer W is taken out of the FOUP of the loader 3 by a transport device, transported to the stage 10, and placed on the stage 10. Then, the stage 10 is moved to a predetermined position.

Then, all the LEDs 41 of the heating mechanism 40 are turned on, and light output from the LED 41 and a flow rate of the refrigerant flowing through the refrigerant flow path 32a in the stage 10 are adjusted by the variable flow rate valve 53 based on information acquired from the temperature sensor 31a of the lid member 31 so that the temperature of the lid member 31 becomes uniform in the plane.

In this state, the stage 10 is moved so that the probe 12a provided above the stage 10 and the electrode E of the electronic device D to be inspected on the wafer W are brought into contact with each other. The relay 82 is connected to the wiring 83 of the potential difference measurement unit 16, the potential difference of the above-described potential difference generation circuit in the electronic device D to be inspected is acquired by the potential difference measurement unit 16, and the system identification of the temperature estimation part 60 is performed.

Thereafter, an inspection signal is inputted to the probe 12a by connecting the relay 82 to the wiring 81 side on the tester 4 side. As a result, the inspection of the electronic device D is started.

During the inspection, the temperature of the electronic device D is controlled by the temperature control device 20. In the temperature control device 20, the temperature of the electronic device D is estimated by the temperature estimation part 60, and the temperature of the electronic device D is controlled by the temperature controller 30 or 30' using the estimated temperature of the electronic device D.

Recently, the heat generation density of an electronic device is increasing due to a high integration of a general-purpose central processing unit (CPU), an influence of an increase in clock speed, and an increase in GPU correspondence due to expansion of an application range of artificial intelligence. In particular, since the GPU executes a plurality of calculations at the same time, an amount of heat generated is steadily increasing.

Therefore, when an electronic device is inspected, it is necessary to control the temperature in consideration of the large amount of heat generation of the electronic device. A temperature measurement circuit, such as a PN junction and a ring oscillator, may be incorporated in the electronic device, and the temperature of the electronic device can be measured and controlled by the temperature measurement circuit.

However, since not all electronic devices are equipped with the temperature measurement circuit, and there are some electronic devices which cannot directly measure the temperature, a technology for estimating a temperature of an electronic device with high accuracy is required.

In Patent Document 2, a temperature of an electronic device is statically estimated from a predetermined heat transfer constant and power consumption when the electronic device alone is inspected, and the temperature of the electronic device is controlled. However, a heat transfer coefficient is a dynamic characteristic, and in the static estimation as in Patent Document 2, estimation accuracy may be insufficient. Further, the heat transfer coefficient changes according to a contact state between a heat generation source and a transfer member, and when the contact state changes, it becomes an error in the temperature of the electronic device.

On the other hand, in the present embodiment, the temperature estimation part 60 dynamically estimates the temperature of the electronic device D using [1] the electric power supplied from the tester 4 to the electronic device D during the inspection, [2] the electric power applied to the irradiation LED for heating the electronic device D (an amount of irradiated heat of the LED), and [3] the temperature in the vicinity of the electronic device D. Specifically, the temperature estimation part 60 expresses the temperature rise from the heat generated from the electronic device D with the above [1] and [2] as manipulated variables and the [3] as the output and estimates the temperature of the electronic device.

In this way, since a dynamic system that represents the temperature rise from heat generated from the electronic device D with a dynamic model is used, even when the electric power is supplied from the tester 4 to the electronic device D and the electronic device D generates heat, the temperature of the electronic device D can be estimated with high accuracy, and temperature control can be realized with high accuracy. Further, since the temperature of the electronic device is estimated from manipulated variables, the electric power (the power consumption) supplied to the electronic device D, and the vicinity temperature (for example, the stage temperature), a modeling error is small. Furthermore, since the temperature is estimated dynamically, a response speed is also improved.

Further, although the temperature rise due to the heat generation of the electronic device D is an internal state that cannot be directly observed, the temperature of the electronic device can be estimated relatively easily using an observer.

Furthermore, conventionally, although in the case of a prober that inspects an electronic device formed on a wafer, an influence of the heat generated from the electronic device on the temperature of the electronic device was not considered, the temperature estimation part 60 can estimate the temperature of the electronic device with high accuracy by expressing the temperature rise due to the heat generated from the electronic device D with a dynamic model and taking into account the heat generated from the electronic device D.

Furthermore, since the temperature of the electronic device can be estimated by taking into account the heat generated from the electronic device in a state in which the electronic device is formed on the wafer, not only can the temperature of the electronic device be estimated with higher accuracy than the static temperature estimation in Patent Document 2, but also package cost at the time of inspection becomes unnecessary.

Furthermore, in a system in which white noise is added, an amount of error thereof can be corrected, and the temperature of the electronic device can be estimated. Therefore, it is effective for a system that dynamically changes load power as in the present embodiment.

Further, when the temperature controller 30 of the first example is used as the temperature controller, temperature control is performed by sliding mode control using the power applied to the LED 41, which is a heating source, as a manipulated variable, and cooling mode control using the power (the opening and closing signal of the high-speed valve) applied to the high-speed valve 54, which a cooling source, as a manipulated variable. At this time, as described above, the switching controller 73 determines whether to use the output (the control input) of the sliding mode controller 71 as it is, or to perform the cooling mode control using the nonlinear term $u_{nl}$ as the opening and closing signal of the high-speed valve 54, according to the value of the nonlinear term $u_{nl}$. It is also possible to control the temperature of the electronic device D only by the sliding mode control using the power applied to the LED 41 as manipulated variable while the flow rate of the refrigerant is constant, but in that case, when the heat generated from the electronic device D becomes large, sufficient temperature control may not be possible.

On the other hand, in the temperature controller 30 of the first example, when the heat generated from the electronic device D is large and the non-linear term $u_{nl}$ of the sliding mode control is negative during the sliding mode control, the switching controller 73 switches to the cooling mode control. Thus, the stage 10 can be cooled more than the case when the LED 41 is turned off, and cooling capacity is enhanced. Therefore, even when the electronic device D generates a very large amount of heat, the temperature of the electronic device D can be sufficiently cooled, and the temperature of the electronic device D can be controlled with good controllability. A position of the high-speed valve 54 at this time is preferably close as possible to the stage 10 from the viewpoint of reducing wasted time as much as possible.

Further, since the cooling mode control is performed using the high-speed valve 54, the high-speed valve 54 can be opened or closed according to the positive and negative fluctuations of the nonlinear term $u_{nl}$ used as the switching signal, and cooling control can be performed with high accuracy.

When the temperature controller 30' of the second example is used as the temperature controller, the switching controller 73' determines whether to use the output of the sliding mode controller 71 as it is or to use the second manipulated variable obtained by adding the sliding mode output and the output of the cooling mode controller 72, according to the value of the nonlinear term $u_{nl}$.

In the first example, the cooling mode controller 72 opens or closes the high-speed valve 54, which is operated at a high speed of 0.1 sec or less, according to high-speed switching due to the nonlinear term $u_{nl}$. Thus, the electronic device D can be cooled more than when the LED 41 is turned off, and the temperature controllability of the electronic device D when there is a very large heat generation disturbance is ensured.

However, in the temperature controller 30 of the first example, controllability is good, but when the nonlinear term $u_{nl}$ is negative, only the operation of the high-speed valve 54 may result in a transient response to rapid cooling. That is, in order to compensate for a temperature drop of the electronic device D when the high-speed valve 54 is opened by the switching controller 73, it is necessary to increase the output of the LED 41, and timing for a next cooling (timing of opening the high-speed valve) is also earlier. Therefore, at the time of controlling with the switching controller 73, the amplitude of a current value tends to be large and the frequency of opening the high-speed valve 54 tends to increase.

On the other hand, in the temperature controller 30' of the second example, not only the output of the high-speed valve of the cooling mode controller 72 but also the output of the sliding mode controller 71 is added as the second manipulated variable when the nonlinear term $u_{nl}$ is negative. As described above, since a control signal is simultaneously sent to the LED 41 during the operation of the high-speed valve 54, there is an advantage that the transient response to rapid cooling can be alleviated. Therefore, in addition to the effect of the temperature controller 30 of the first example, effects such as following can be obtained: the amplitude of the current value can be made small, the frequency of opening the high-speed valve 54 can be reduced, the amplitude can be smaller and smooth temperature control is possible.

The inspection of an electronic device may be performed on a plurality of devices at one time, or may be performed on all electronic devices at one time as in collective contact probing adopted in a dynamic random access memory (DRAM) or the like. In either case, the temperature of the electronic device to be inspected can be controlled with good controllability using both the sliding mode control that uses the power of the LED 41 as manipulated variable and the cooling mode control that opens/closes the high-speed valve as described above.

Other Applications

Although the embodiments have been described above, the embodiments disclosed this time are exemplary in all respects and should be considered as being not restrictive. The above embodiments may be omitted, replaced or modified into various forms without departing from the scope of the appended claims and their gist.

For example, in the above embodiments, the case in which the LED is used as the heating source has been described, but the heating source is not limited to the LED and may be another heating source such as a resistance heater. Further, in the above embodiments, an electronic device (a chip) on a wafer is illustrated as an example of a target object, but the present disclosure is not limited thereto. Further, although the case in which the temperature control device is applied to the inspection apparatus is illustrated, the present disclosure is not limited thereto.

DESCRIPTION OF REFERENCE NUMERALS

1: inspection apparatus
2: inspection part
3: loader
4: tester
10: stage
12: probe card
12a: probe
13: interface
15: controller
20: temperature control device
30, 30': temperature controller
31a: temperature sensor
32a: refrigerant flow path
40: heating mechanism
41: LED
50: cooling mechanism
52: refrigerant pipe
53: variable flow rate valve
54: high-speed valve
60: temperature estimation part
61: observer system
62, 66: dynamic system
63, 67: observer
64: power supply circuit part
71: sliding mode controller
72: cooling mode controller
73, 73': switching controller
74: plant model
77: adder
D: electronic device
W: wafer

The invention claimed is:

1. A temperature control device which controls a temperature of a target object subject to temperature control, comprising:
a heating mechanism having a heating source configured to heat the target object;
a temperature measuring instrument configured to measure a vicinity temperature of the target object;
a temperature estimation part configured to dynamically estimate the temperature of the target object based on power applied to the heating source, power supplied to the target object, and the vicinity temperature; and
a temperature controller configured to control the temperature of the target object by controlling the power applied to the heating source based on an estimated temperature of the target object,
wherein the temperature control device further comprises a cooling mechanism having a cooling source configured to cool the target object,
the temperature controller includes:
a sliding mode controller configured to use the power applied to the heating source as a manipulated variable;
a cooling mode controller configured to use the power applied to the cooling source as a manipulated variable; and
a switching controller configured to determine whether to output an output of the sliding mode controller as it is to the heating source as a first manipulated variable, or to use an output of the cooling mode controller as a second manipulated variable without using the output of the sliding mode controller, according to a value of a non-linear term among linear and non-linear terms that are outputs of the sliding mode controller.

2. The temperature control device of claim 1, wherein the temperature estimation part estimates the temperature of the target object by a dynamic control system using the power applied to the heating source and the power supplied to the target object as manipulated variables and the vicinity temperature as an output value.

3. The temperature control device of claim 2, wherein the temperature estimation part estimates the temperature of the target object by an observer control system configured with the dynamic control system and an observer.

4. The temperature control device of claim 1, wherein the temperature measuring instrument of the temperature estimation part measures a temperature of a holder that holds the target object or a temperature of a supply member that supplies power to the target object as the vicinity temperature.

5. The temperature control device of claim 1, wherein the cooling mechanism cools the target object with a refrigerant, the cooling source is a high-speed valve that opens or closes a flow path of the refrigerant, and the output of the cooling mode controller is an opening/closing signal to the high-speed valve.

6. A temperature control device which controls a temperature of a target object subject to temperature control, comprising:
a heating mechanism having a heating source configured to heat the target object;
a temperature measuring instrument configured to measure a vicinity temperature of the target object;
a temperature estimation part configured to dynamically estimate the temperature of the target object based on power applied to the heating source, power supplied to the target object, and the vicinity temperature; and
a temperature controller configured to control the temperature of the target object by controlling the power applied to the heating source based on an estimated temperature of the target object,
wherein the temperature control device further comprises a cooling mechanism having a cooling source configured to cool the target object,
the temperature controller includes:
a sliding mode controller configured to use the power applied to the heating source as a manipulated variable;
a cooling mode controller configured to use the power applied to the cooling source as a manipulated variable; and
a switching controller configured to determine whether to output an output of the sliding mode controller as it is to the heating source as a first manipulated variable, or to use a sum of an output of the sliding mode controller and an output of the cooling mode controller as a second manipulated variable, according to a value of a non-linear term among linear and non-linear terms that are outputs of the sliding mode controller.

7. The temperature control device of claim 6, wherein the cooling mechanism cools the target object with a refrigerant, the cooling source is a high-speed valve that opens or closes a flow path of the refrigerant, and the output of the cooling mode controller is an opening/closing signal to the high-speed valve.

8. The temperature control device of claim 1, wherein the heating source is a light-emitting diode (LED), and a first manipulated variable is a current value applied to the LED.

9. The temperature control device of claim 1, wherein the target object is an electronic device provided on a substrate.

* * * * *